US012811589B2

(12) United States Patent
Yagi

(10) Patent No.: US 12,811,589 B2
(45) Date of Patent: Nov. 24, 2026

(54) LEVEL SHIFTING CIRCUIT

(71) Applicant: Kioxia Corporation, Tokyo (JP)

(72) Inventor: Toshihiro Yagi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 19/239,573

(22) Filed: Jun. 16, 2025

(65) Prior Publication Data

US 2026/0172032 A1 Jun. 18, 2026

(30) Foreign Application Priority Data

Dec. 18, 2024 (JP) ................................ 2024-221781

(51) Int. Cl.

| | |
|---|---|
| ***H03K 19/0185*** | (2006.01) |
| ***G11C 5/14*** | (2006.01) |
| ***H03K 19/003*** | (2006.01) |

(52) U.S. Cl.

CPC ............... *H03K 19/018521* (2013.01); *H03K 19/00315* (2013.01); *G11C 5/14* (2013.01)

(58) Field of Classification Search

CPC ............... G11C 5/14; H03K 19/00315; H03K 19/018521

See application file for complete search history.

(56) References Cited

U.S. PATENT DOCUMENTS

| | | | | |
|---|---|---|---|---|
| 11,869,623 | B2 * | 1/2024 | Yu | G11C 7/065 |
| 2023/0044191 | A1 * | 2/2023 | Yagi | H03K 19/018521 |
| 2023/0092548 | A1 | 3/2023 | Dua et al. | |
| 2024/0014818 | A1 * | 1/2024 | Lee | H03K 19/018521 |
| 2024/0106348 | A1 | 3/2024 | Yagi | |
| 2025/0183895 | A1 * | 6/2025 | Lee | H03K 19/018521 |

FOREIGN PATENT DOCUMENTS

| | | |
|---|---|---|
| JP | 2024-046090 A | 4/2024 |

* cited by examiner

*Primary Examiner* — Patrick C Chen
(74) *Attorney, Agent, or Firm* — Foley & Lardner LLP

(57) ABSTRACT

First and second inverters are coupled between first and second nodes, includes first and second input nodes, and includes first and second output nodes. First and second transistors are coupled between third and fifth nodes and includes gates coupled to the first input node and a sixth node. Third and fourth transistors are coupled between the third and sixth nodes and includes gates coupled to the second input node and the fifth node. A fifth transistor is coupled between the fifth node and the first output node and includes a gate coupled to the first node. A first capacitor is coupled between the fifth node and the first output node. A sixth transistor is coupled between the sixth node and the second output node and includes a gate coupled to the first node. A second capacitor is coupled between the sixth node and the second output node.

17 Claims, 9 Drawing Sheets

LEVEL SHIFTING CIRCUIT

CROSS-REFERENCE TO RELATED APPLICATION

This application is based upon and claims the benefit of priority from Japanese Patent Application No. 2024-221781, filed Dec. 18, 2024, the entire contents of which are incorporated herein by reference.

FIELD

Embodiments described herein relate generally to a level shifting circuit.

BACKGROUND

Level shifting circuits convert an input voltage into another voltage having a different magnitude, and output the other voltage. Conventionally, level shifting circuits having a tolerant function unintentionally apply an excessive voltage to each circuit element, and impair the reliability of each of the circuit elements in some cases. There is a request for a level shifting circuit that prevents an excessive voltage from being applied to a circuit element.

DETAILED DESCRIPTION

In general, according to one embodiment, a level shifting circuit includes a first inverter; a second inverter; a first transistor; a second transistor; a third transistor; a fourth transistor; a fifth transistor; a first capacitor; a sixth transistor; and a second capacitor.

The first inverter is coupled between a first node and a second node, includes a first input node that receives a first signal, and includes a first output node. The first node receives a first potential. The second node receives a second potential that is lower than the first potential. The second inverter is coupled between the first node and the second node, includes a second input node that receives a signal that is complementary to the first signal, and includes a second output node. The first transistor is coupled between a third node and a fourth node, and includes a gate that is coupled to the first input node. The third node receives a third potential that is higher than the first potential. The second transistor is coupled between the fourth node and a fifth node, and includes a gate that is coupled to a sixth node. The third transistor is coupled between the third node and a seventh node, and includes a gate that is coupled to the second input node. The fourth transistor is coupled between the seventh node and the sixth node, and includes a gate that is coupled to the fifth node. The fifth transistor is coupled between the fifth node and the first output node, and includes a gate that is coupled to the first node. The first capacitor is coupled between the fifth node and the first output node. The sixth transistor is coupled between the sixth node and the second output node, and includes a gate that is coupled to the first node. The second capacitor that is coupled between the sixth node and the second output node.

Embodiments will now be described with reference to the figures. The entire description of a particular embodiment applies to another embodiment unless an explicit mention is made otherwise, or an obvious elimination is involved.

The specification and the claims, when mentioning that a particular (first) component is "coupled" to another (second) component, intend to cover both the form of the first component directly coupled to the second component and the form of the first component coupled to the second component via one or more components which are always or selectively conductive. Herein, two elements being "substantially the same" means permitting cases where the two elements are formed in an attempt to be the same, but are not completely the same due to unavoidable reasons such as technical limitations for forming the elements and/or limitations on technique for measuring.

1. First Embodiment

1.1. Configuration (Structure)

Figure 1:
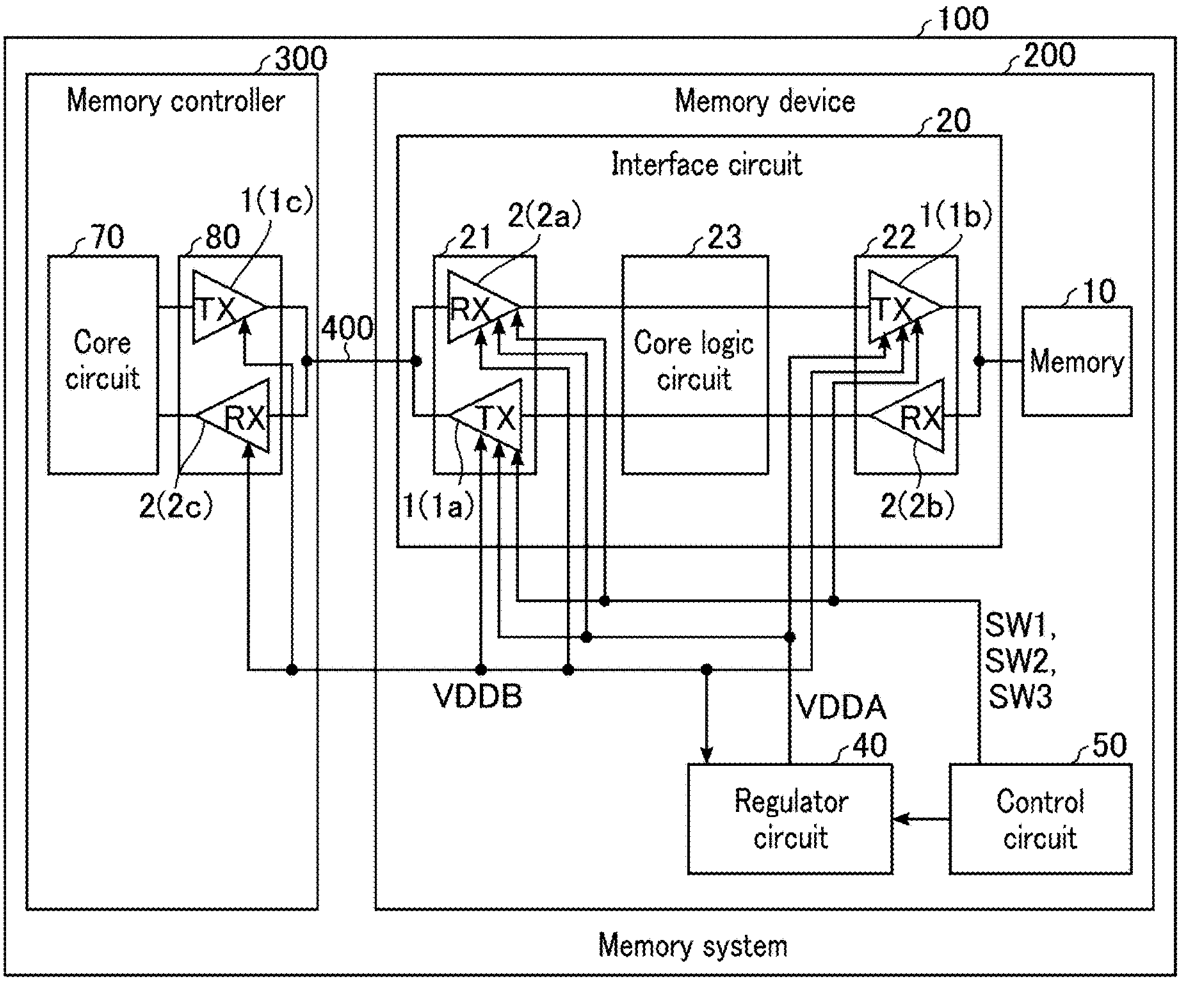
FIG. 1 is a block diagram of a memory system that includes a level shifting circuit according to a first embodiment.

A level shifting circuit having a tolerant function (a tolerant level shifter) according to an embodiment prevents an excessive voltage from being applied to each circuit element in such a way that a breakdown does not occur in each of the circuit elements. The circuit element includes, for example, a transistor. FIG. 1 is a block diagram of a memory system that includes a level shifting circuit according to a first embodiment. An example of a memory system 100 that includes the level shifting circuit according to the first embodiment includes a solid state drive (SSD). The memory system 100 includes a memory device 200 and a memory controller 300. The memory device 200 stores data. The memory controller 300 controls the memory device 200. In one example, the memory device 200 and the memory controller 300 are provided on a printed circuit board. The memory device 200 and the memory controller 300 are coupled by wiring 400 to be communicable to each other. In one example, the wiring 400 is provided on the printed circuit board.

The memory device 200 includes a memory 10, an interface circuit 20, a regulator circuit 40, and a control circuit 50. The memory 10 includes memory cells and a peripheral circuit, and stores data in the memory cells under the control of the peripheral circuit. In one example, the memory 10 has a form of a chip that is implemented by a semiconductor.

The interface circuit 20 couples the memory controller 300 and the memory 10, and performs processing for transmitting and receiving a signal between the memory controller 300 and the memory 10. The interface circuit 20 includes input/output circuits 21 and 22 and a core logic circuit 23.

The input/output circuit 21 receives a signal from the memory controller 300, and outputs a signal based on the received signal. The input/output circuit 21 is coupled to the wiring 400. The input/output circuit 21 includes a transmission circuit 1 (1*a*) and a reception circuit 2 (2*a*). The reception circuit 2*a* receives a signal from the memory controller 300 on the wiring 400, and transmits an output signal based on the received signal to the core logic circuit 23. The transmission circuit 1*a* receives a signal from the core logic circuit 23, and transmits a signal based on the received signal to the memory controller 300 on the wiring 400.

The input/output circuit 22 receives a signal from the core logic circuit 23, and outputs a signal based on the received signal. The input/output circuit 22 includes a transmission circuit 1 (1*b*) and a reception circuit 2 (2*b*). The reception circuit 2*b* receives a signal from the memory 10, and transmits a signal based on the received signal to the core logic circuit 23. The transmission circuit 1*b* receives a signal from the core logic circuit 23, and transmits a signal based on the received signal to the memory 10.

The core logic circuit 23 receives a signal from the reception circuit 2*a*, and transmits a signal based on the received signal to the transmission circuit 1*b*. The core logic circuit 23 receives a signal from the reception circuit 2*b*, and transmits a signal based on the received signal to the transmission circuit 1*a*.

A voltage VDDB has a fixed magnitude. In one example, the voltage VDDB is a power supply voltage supplied from an outside of the memory system 100. The voltage VDDB is supplied to the regulator circuit 40 and the transmission circuits 1*a* and 1*b*.

The regulator circuit 40 receives a voltage, and outputs a voltage having another magnitude based on the received voltage. The regulator circuit 40 receives the voltage VDDB, and operates by using the voltage VDDB. The regulator circuit 40 outputs a voltage VDDA. The voltage VDDA is lower than the voltage VDDB. The voltage VDDA has a fixed magnitude. The regulator circuit 40 supplies the voltage VDDA to the transmission circuits 1*a* and 1*b*.

The control circuit 50 controls the interface circuit 20 and the regulator circuit 40. The control circuit 50 generates control signals SW1, SW2, and SW3, and supplies the control signals SW1, SW2, and SW3 to the transmission circuits 1*a* and 1*b*.

The memory controller 300 includes a core circuit 70 and an input/output circuit 80. The core circuit 70 performs various types of processing for controlling the memory device 200. The memory controller 300 processes data and generates data to be stored in the memory device 200. The memory device 200 generates various signals for controlling the memory device 200.

The input/output circuit 80 receives a signal from the core circuit 70, and outputs a signal based on the received signal. The input/output circuit 80 receives a signal from the memory device 200, and transmits a signal based on the received signal to the core circuit 70. The input/output circuit 80 is coupled to the wiring 400. The input/output circuit 80 includes a reception circuit 2 (2*c*) and a transmission circuit 1 (1*c*).

Figure 2:
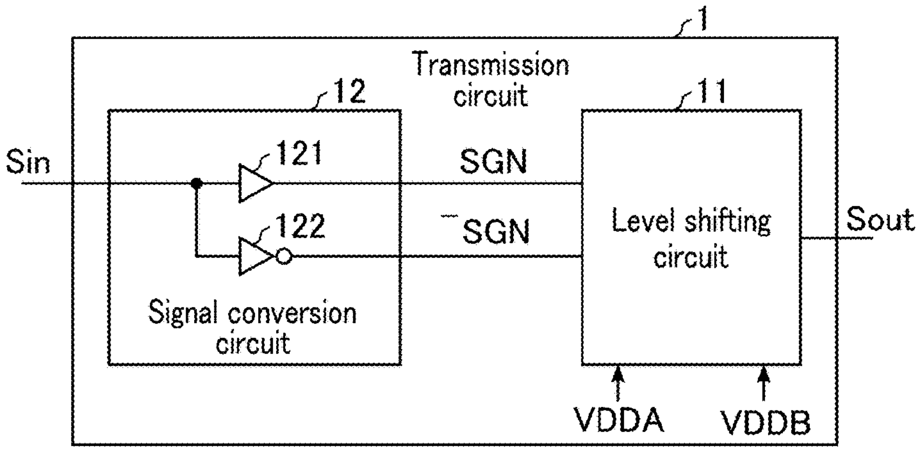
FIG. 2 is a block diagram of a transmission circuit that includes the level shifting circuit according to the first embodiment.

FIG. 2 is a block diagram of a transmission circuit that includes the level shifting circuit according to the first embodiment. As illustrated in FIG. 2, the transmission circuit 1 includes a level shifting circuit 11 and a signal conversion circuit 12.

The signal conversion circuit 12 receives a signal Sin of a single end type, and converts the received signal Sin into signals SGN and ¯SGN of a differential type. Then, the signal conversion circuit 12 outputs the signals SGN and ¯SGN. The symbol "¯" indicates an inverted logic of a logic of a signal having a name without the symbol "¯". Stated another way, the signal having the name without the symbol "¯" and a signal having a name with the symbol "¯" are complementary to each other.

The signal conversion circuit 12 includes a buffer circuit 121 and an inverter circuit 122. The buffer circuit 121 receives the signal Sin, and outputs the signal SGN. The signal SGN has the same logic as a logic of the signal Sin. The signal SGN has a potential VDDA at a high level, and has a potential VSS at a low level. The potential VDDA is a potential that wiring has as a result of the wiring receiving the voltage VDDA. The potential VDDA has substantially the same magnitude as the magnitude of the voltage VDDA. The potential VSS is a potential that the wiring has as a result of receiving a reference voltage VSS. The potential VSS has substantially the same magnitude as the magnitude of the reference voltage VSS. The reference voltage VSS is lower than the voltage VDDA, and is 0 V in one example.

The inverter circuit 122 receives the signal Sin, and outputs the signal ¯SGN. The signal ¯SGN has an inverted logic of the logic of the signal Sin. The signal ¯SGN has the potential VDDA at the high level, and has the potential VSS at the low level.

The level shifting circuit 11 receives the signals SGN and ¯SGN, converts the received signals SGN and ¯SGN into a signal Sout of the single end type, and outputs the signal Sout. The signal Sout has a potential VDDB at the high level, and has the potential VSS at the low level. The potential VDDB is a potential that wiring has as a result of the wiring receiving the voltage VDDB, and has the substantially the same magnitude as the magnitude of the voltage VDDB. The level shifting circuit 11 receives the voltage VDDA and the voltage VDDB.

Figure 3:
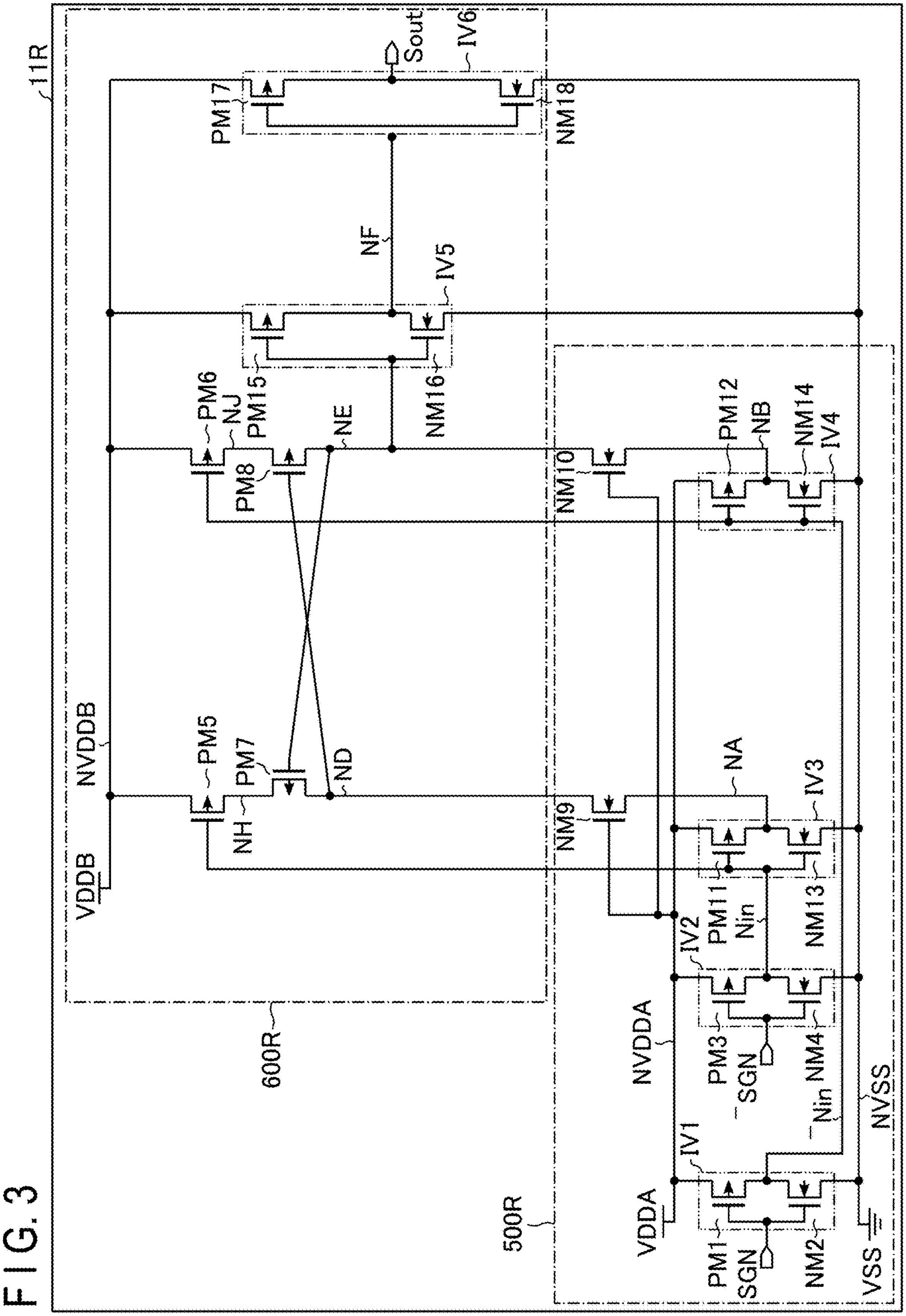
FIG. 3 is a circuit diagram of a level shifting circuit in a comparative example.

Here, a level shifting circuit in a comparative example will be described. FIG. 3 is a circuit diagram of the level shifting circuit in the comparative example.

A level shifting circuit 11R in the comparative example includes a pre-stage circuit 500R and a post-stage circuit 600R. The pre-stage circuit 500R is a circuit that operates at the voltage VDDA serving as a power supply potential. The post-stage circuit 600R is a circuit that operates at the voltage VDDB serving as a power supply potential. The voltage VDDB is a voltage that is relatively higher than the voltage VDDA. The level shifting circuit 11R has a configuration in which the pre-stage circuit 500R and the post-stage circuit 600R are coupled in series between the reference voltage VSS and the voltage VDDB.

The pre-stage circuit 500R includes inverter circuits IV1, IV2, IV3, and IV4 and n-type metal oxide semiconductor field effect transistors (MOSFETs) NM9 and NM10.

The inverter circuits IV1, IV2, IV3, and IV4 are coupled in parallel between the node NVDDA and a node NVSS. The node NVDDA receives the voltage VDDA. The node NVSS receives the reference voltage VSS.

The inverter circuit IV1 receives the signal SGN at an input, and is coupled to the node ¯Nin at an output. The inverter circuit IV1 outputs a high-level signal having the magnitude of the potential VDDA, and a low-level signal having the magnitude of a potential VSS. In one example, the inverter circuit IV1 includes a p-type MOSFET PM1 and an n-type MOSFET NM2. The transistors PM1 and NM2 are coupled in series in this order between the node NVDDA and the node NVSS. The transistors PM1 and NM2 receive the signal SGN at a gate. A node to which the transistors PM1 and NM2 are coupled functions as the node ¯Nin.

The inverter circuit IV2 receives the signal ¯SGN at an input, and is coupled to the node Nin at an output. The inverter circuit IV2 outputs a high-level signal having the magnitude of the potential VDDA, and a low-level signal having the magnitude of the potential VSS. In one example, the inverter circuit IV2 includes a p-type MOSFET PM3 and an n-type MOSFET NM4. The transistors PM3 and NM4 are coupled in series in this order between the node NVDDA and the node NVSS. The transistors PM3 and NM4 receive the signal ¯SGN at a gate. A node to which the transistors PM3 and NM4 are coupled functions as the node Nin.

The inverter circuit IV3 is coupled to the node Nin at an input, and is coupled to a node NA at an output. The inverter circuit IV3 outputs a high-level signal having the magnitude of the potential VDDA, and a low-level signal having the magnitude of the potential VSS. In one example, the inverter circuit IV3 includes a p-type MOSFET PM11 and an n-type MOSFET NM13. The transistors PM11 and NM13 are coupled in series in this order between the node NVDDA and the node NVSS. The transistors PM11 and NM13 are coupled to the node Nin at a gate. A node to which the transistors PM11 and NM13 are coupled functions as the node NA.

The inverter circuit IV4 is coupled to the node ¯Nin at an input, and is coupled to a node NB at an output. The inverter circuit IV4 outputs a high-level signal having the magnitude of the potential VDDA, and a low-level signal having the magnitude of the potential VSS. In one example, the inverter circuit IV4 includes a p-type MOSFET PM12 and an n-type MOSFET NM14. The transistors PM12 and NM14 are coupled in series in this order between the node NVDDA and the node NVSS. The transistors PM12 and NM14 are coupled to the node ¯Nin at a gate. A node to which the transistors PM12 and NM14 are coupled functions as the node NB.

The transistor NM9 is coupled between a node ND and the node NA. The transistor NM9 is coupled to the node NVDDA at a gate.

The transistor NM10 is coupled between a node NE and the node NB. The transistor NM10 is coupled to the node NVDDA at a gate.

Circuit elements in the pre-stage circuit 500R operate at a power supply potential of the voltage VDDA, which is relatively low. Accordingly, the transistors PM1, NM2, PM3, NM4, NM9, NM10, PM11, NM13, PM12, and NM14 in the pre-stage circuit 500R can be configured by a low breakdown voltage transistor.

The low breakdown voltage transistor may be a low voltage metal oxide semiconductor (LVMOS) transistor. The low breakdown voltage transistor can be achieved by making a gate insulating film relatively thin. The low breakdown voltage transistor has a relatively low threshold voltage, and can be appropriately turned on or off at the voltage VDDA, which is the power supply potential of the pre-stage circuit 500R.

The post-stage circuit 600R includes inverter circuits IV5 and IV6, p-type MOSFETs PM5, PM6, PM7, and PM8.

The transistor PM5 is coupled between a node NVDDB and a node NH. The Node NVDDB receives the voltage VDDB. The transistor PM5 is coupled to the node Nin at a gate.

The transistor PM7 is coupled between the node NH and the node ND. The transistor PM7 is coupled to a node NE at a gate.

The transistor PM6 is coupled between the node NVDDB and a node NJ. The transistor PM6 is coupled to the node ¯Nin at a gate.

The transistor PM8 is coupled between the node NJ and the node NE. The transistor PM8 is coupled to the node ND at a gate.

The inverter circuit IV5 is coupled to the node NE at an input, and is coupled to a node NF at an output. The inverter circuit IV5 outputs a high-level signal having the magnitude of the potential VDDB, and a low-level signal having the magnitude of the potential VSS. In one example, the inverter circuit IV5 includes a p-type MOSFET PM15 and an n-type MOSFET NM16. The transistors PM15 and NM16 are coupled in series in this order between the node NVDDB and the node NVSS. The transistors PM15 and NM16 are coupled to the node NE at a gate. A node to which the transistors PM15 and NM16 are coupled functions as the node NF.

The inverter circuit IV6 is coupled to the node NF at an input, and outputs a signal Sout at an output. The inverter circuit IV6 outputs a high-level signal having the magnitude of the potential VDDB, and a low-level signal having the magnitude of the potential VSS. In one example, the inverter circuit IV6 includes a p-type MOSFET PM17 and an n-type MOSFET NM18. The transistors PM17 and NM18 are coupled in series in this order between the node NVDDB and the node NVSS. The transistors PM17 and NM18 are coupled to the node NF at a gate. A node to which the transistors PM17 and NM18 are coupled outputs the signal Sout.

Circuit elements in the post-stage circuit 600R operate at a power supply potential of the relatively high voltage VDDB (>VDDA). Accordingly, the transistors PM5, PM6, PM7, PM8, PM15, NM16, PM17, and NM18 in the post-stage circuit 600R can be configured by a high breakdown voltage transistor.

The high breakdown voltage transistor may be a high voltage metal oxide semiconductor (HVMOS) transistor or a middle voltage metal oxide semiconductor (MVMOS) transistor. The high breakdown voltage transistor and the middle breakdown voltage transistor can be achieved by making the gate insulating film relatively thick. The high breakdown voltage transistor and the middle breakdown voltage transistor have a threshold voltage that is relatively higher than the threshold voltage of the low breakdown voltage transistor, and can be appropriately turned on or off at the voltage VDDB, which is a power supply potential of the post-stage circuit 600R. Furthermore, the high breakdown voltage transistor and the middle breakdown voltage transistor require a mounting area that is larger than the mounting area of the low breakdown voltage transistor.

Figure 4:
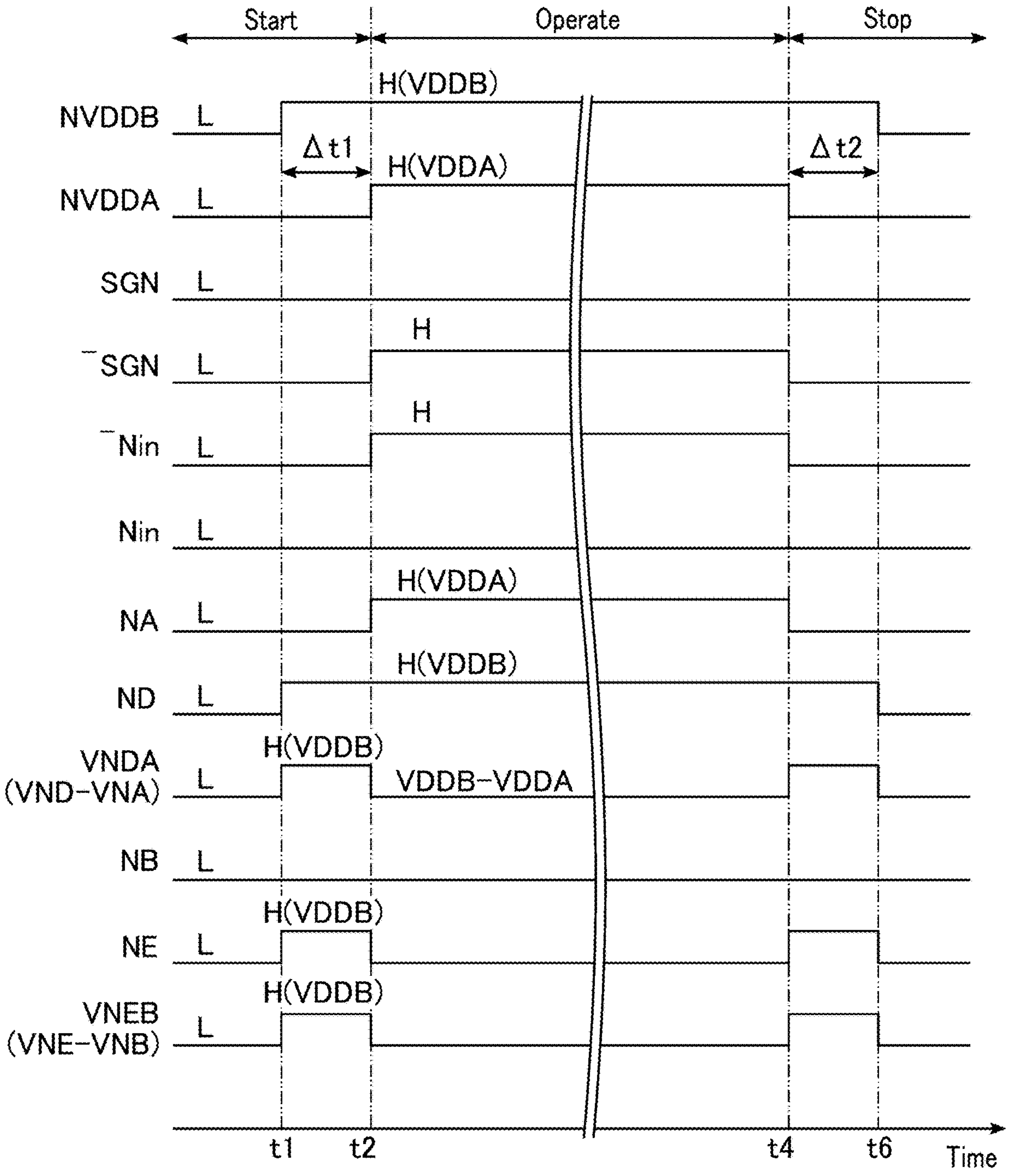
FIG. 4 illustrates, along the time axis, potentials of some nodes and potentials of some signals during starting and during stopping of the level shifting circuit in the comparative example.

FIG. 4 illustrates, along the time axis, potentials of some nodes and potentials of some signals during starting and during stopping of the level shifting circuit in the comparative example. A period of starting ranges from the start of the period illustrated in FIG. 4 to time t2. A period of stopping ranges from time t4 to the end of the period illustrated in FIG. 4.

At a point in time of the start of the period illustrated in FIG. 4, all of the nodes and the signals that are illustrated in FIG. 4 have a low (L) level or the potential VSS. Both nodes NVDDA and NVDDB have the low level, and therefore the level shifting circuit 11 is not operating, and the nodes NA, ND, NB, and NE have the low level.

A potential difference VNDA is equal to potential VND—potential VNA. The potential VND is a potential of the node ND. The potential VNA is a potential of the node NA. A potential difference VNEB is equal to potential VNE—potential VNB. The potential VNE is a potential of the node NE. The potential VNB is a potential of the node NB.

At time t1, the voltage VDDB starts to be applied to the node NVDDB, and the node NVDDB has a high (H) level, namely, the potential VDDB. At time t1, based on the node NVDDB having the potential VDDB, a regulator circuit 40 starts operation. Due to leakage currents of the transistors PM5, PM6, PM7, and PM8, a current flows from the node NVDDB into the node ND and the node NE, and a potential of the node ND or the node NE can rise.

It takes time for the regulator circuit 40 to start to output the voltage VDDA after the voltage VDDB started to be applied. Therefore, even at time t1, the potential of the node NVDDA has the low level, and the node NA and the node NB have the low level. Thus, both the potential difference VNDA and the potential difference VNEB have the high level, that is, roughly the same magnitude as the magnitude of the potential VDDB.

The regulator circuit 40 starts operation at time t1, and at time t2 after a period Δt1 passed from time t1, the node NVDDA has a high-level potential, namely, the potential VDDA.

Based on the node NVDDA having a high-level potential, the inverter circuits IV1, IV2, IV3, and IV4 are enabled. Based on the node NVDDA having a high-level potential, the transistor NM9 is turned on, and the node ND and the node NA are coupled. Based on the node NVDDA having a high-level potential, the transistor NM10 is turned on, and the node NE and the node NB are coupled. Based on the enabling of the inverter circuits IV1, IV2, IV3, and IV4, connection between the node ND and the node NA, and connection between the node NE and the node NB, the level shifting circuit 11R is enabled.

From time t2, the level shifting circuit 11R has been in an operation state. From time t2, at a timing based on information transmitted by the signals SGN and ¯SGN, the signals SGN and ¯SGN perform a transition between the high level and the low level. FIG. 4 illustrates an example where the signal ¯SGN reaches the high level at time t2. Based on the signal ¯SGN reaching the high level, the node NA has the high level. As a result of this, the potential difference VNDA has a magnitude obtained by subtracting the magnitude of the potential VDDA from the magnitude of the potential VDDB. A difference between the potential VDDB and the potential VDDA is small, and therefore the potential difference VNDA is small. The potentials of some nodes and the potentials of some signals in the operation state will be described later with reference to FIG. 5.

At time t4, the regulator circuit 40 is disabled. As a result of this, the potential of the node NVDDA reaches the low level. As a result of this, the inverter circuits IV1, IV2, IV3, and IV4 are disabled.

At and after time t4, both the signals SGN and ¯SGN keep the low level. FIG. 4 illustrates an example where the signal ¯SGN reaches the low level from the high level at time t4. Based on the signal ¯SGN reaching the low level, the node NA has the low level.

Based on the node NVDDA having a low-level potential, the transistor NM9 is turned off. As a result of this, the node ND and the node NA are. Based on the node NVDDA having a low-level potential, the transistor NM10 is turned off. As a result of this, the node NE and the node NB are disconnected.

At and after time t4, the node NVDDB still has the potential VDDB. Therefore, due to the leakage currents of the transistors PM5, PM6, PM7, and PM8, a current flows from the node NVDDB into the node ND and the node NE, and a potential of the node ND or the node NE can keep a high potential or can rise, and can have the potential VDDB. Therefore, either between the node ND and the node NA or between the node NE and the node NB, a potential difference having a magnitude obtained by subtracting the magnitude of the potential VSS from the magnitude of the potential VDDB is generated. This potential difference is applied to the transistor NM9 or NM10, and can lower the reliability of the transistor NM9 or NM10.

At time t6 after a period Δt2 passed from time t4, application of the voltage VDDB to the node NVDDB is stopped. As a result of this, the node NVDDB has the low level.

Figure 5:
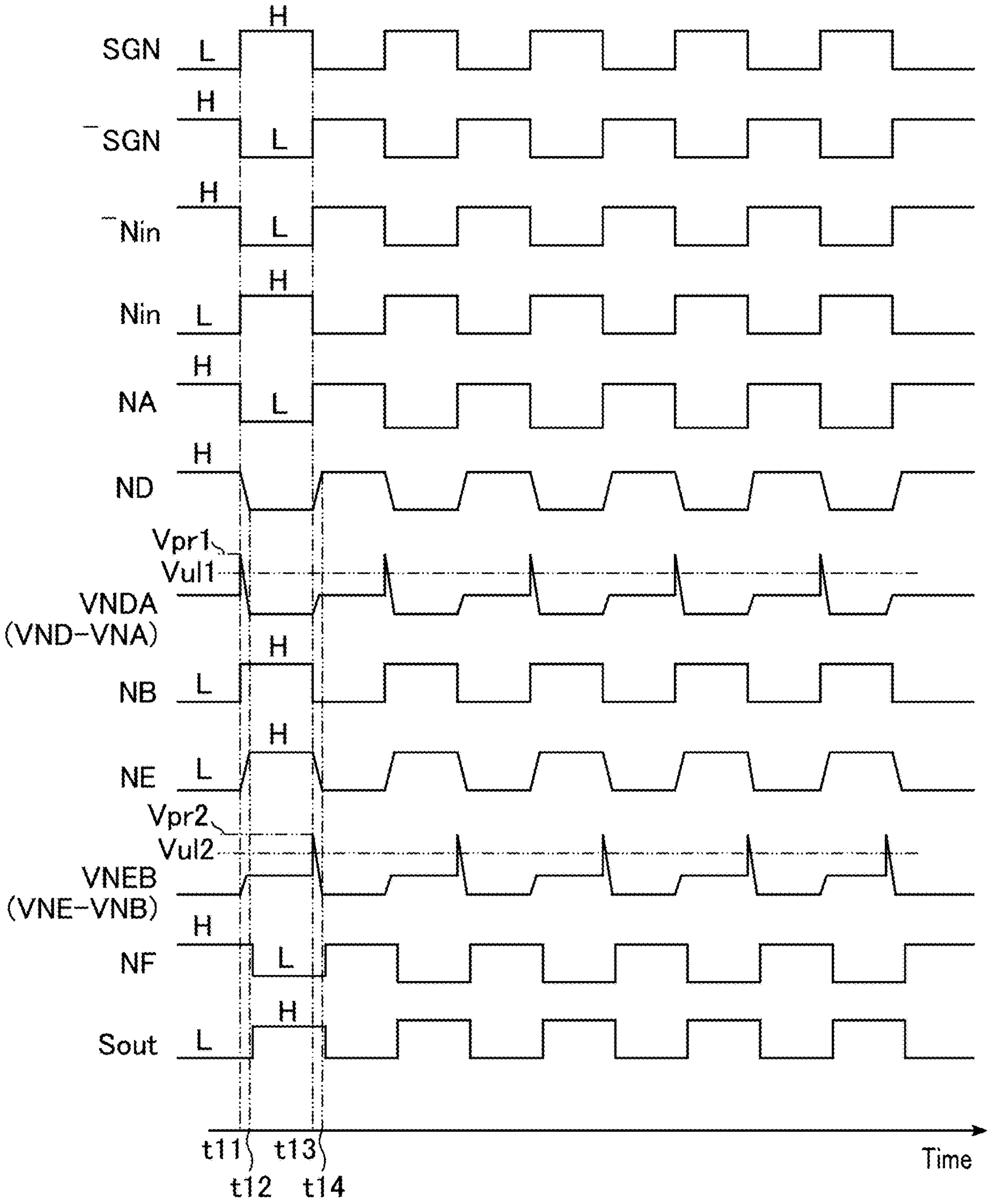
FIG. 5 illustrates, along the time axis, potentials of some nodes and potentials of some signals during operation of the level shifting circuit according to the first embodiment.

FIG. 5 illustrates, along the time axis, potentials of some nodes and potentials of some signals during operation of the level shifting circuit in the comparative example. FIG. 5 illustrates a period of operation, that is, a period between time t2 and t4 of the period illustrated in FIG. 4. FIG. 5 illustrates, as an example, a case where the signal SGN is a clock.

At time t11, the signal SGN reaches the high level, and the signal ¯SGN reaches the low level. As a result of this, the potential of the node ¯Nin reaches the low level, and the potential of the node Nin reaches the high level. Due to this change in a potential, the potential of the node NA reaches the low level, and the potential of the node NB reaches the high level.

The potential of the node ND follows a change in the potential of the node NA. At time t11, the potential of the node NA reaches the low level, but a change in the potential of the node ND is behind the change in the potential of the node NA due to various factors including the parasitic capacitance of wiring. Therefore, before the potential of the node ND reaches the low level and the potential difference VNDA becomes substantially zero at time t12, and immediately after time t11, the potential difference VNDA has a peak magnitude Vpr1. Accordingly, a voltage having substantially the same magnitude as the magnitude of the potential Vpr1 is applied to the transistor NM9. A peak of the potential difference VNDA can exceed a voltage Vul1. This results in application of a high voltage to the transistor NM9, and therefore the transistor NM9 can be broken down, or the lifetime of the transistor NM9 can be shortened. As a result of the above, the reliability of the transistor NM9 deteriorates. The voltage Vul1 is an upper limit voltage that is allowed to be applied to the transistor NM9.

At time t13, the signal SGN reaches the low level, and the signal ¯SGN reaches the high level. As a result of this, the potential of the node ¯Nin reaches the high level, and the potential of the node Nin reaches the low level. Due to this change in potentials, the potential of the node NA reaches the high level, and the potential of the node NB reaches the low level.

The potential of the node NE follows a change in the potential of the node NB. At time t13, the potential of the node NB reaches the low level, but a change in the potential of the node NE is behind a change in the potential of the node NB due to various factors including the parasitic capacitance of wiring. Therefore, before the potential of the node NE reaches the low level and the potential difference VNEB becomes substantially zero at time t14, and immediately after time t13, the potential difference VNEB has a peak magnitude Vpr2. Accordingly, a voltage having substantially the same magnitude as the magnitude of the potential Vpr2 is applied to the transistor NM10. A peak of the potential difference VNEB may exceed a voltage Vul2. This results in application of a high voltage to the transistor NM10, and therefore the transistor NM10 can be broken down, or the lifetime of the transistor NM10 can be shortened. As a result of the above, the reliability of the transistor NM10 deteriorates. The voltage Vul2 is an upper limit value of a voltage that is allowed to be applied to the transistor NM10.

Figure 6:
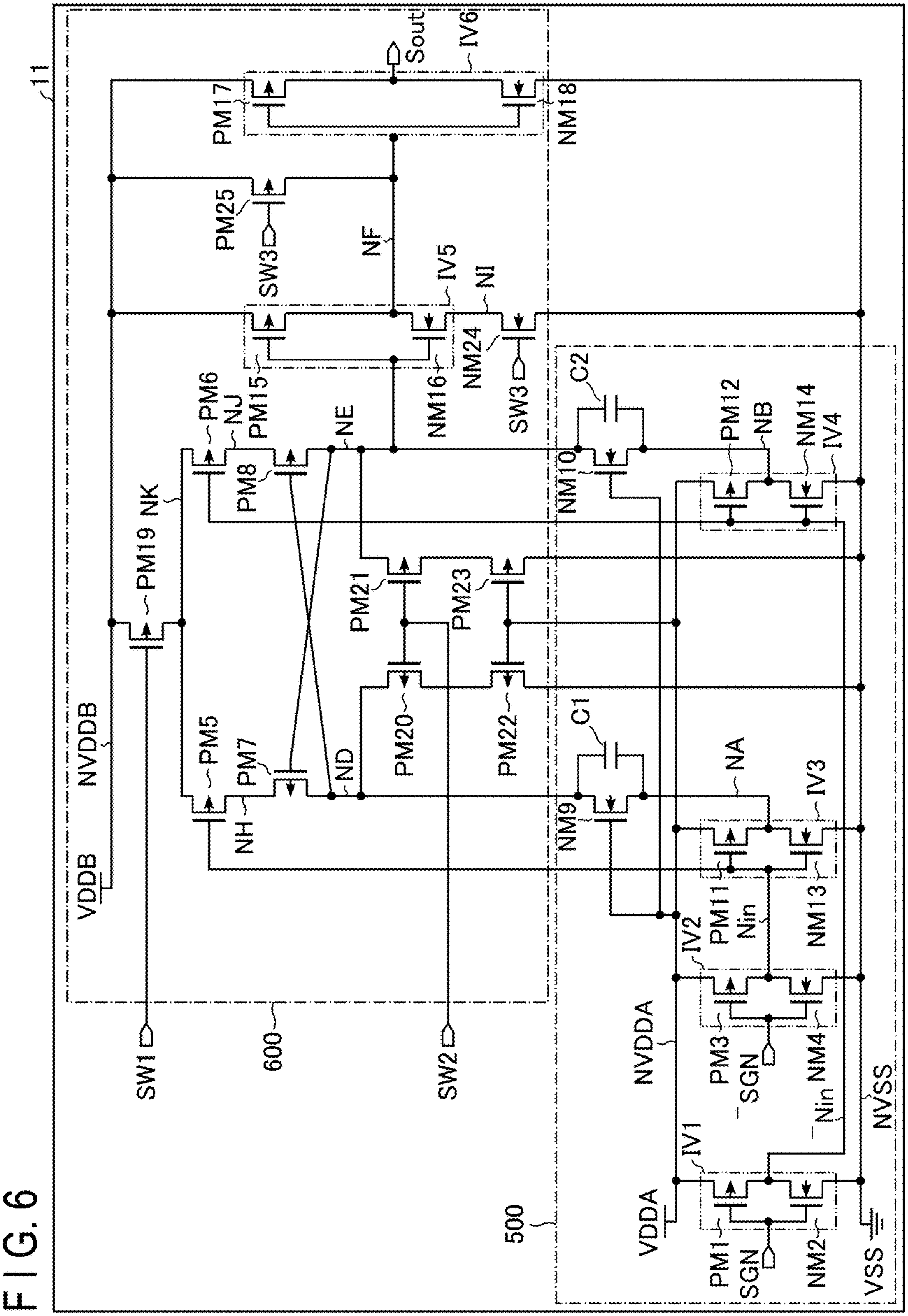
FIG. 6 is a circuit diagram of the level shifting circuit according to the first embodiment.

The level shifting circuit according to the first embodiment that improves the problems described above in the comparative example will be described. FIG. 6 is a circuit diagram of the level shifting circuit according to the first embodiment. As illustrated in FIG. 6, the level shifting circuit 11 includes a pre-stage circuit 500 and a post-stage circuit 600. The pre-stage circuit 500 includes inverter circuits IV1, IV2, IV3, and IV4, n-type MOSFETs NM9 and NM10, and capacitors C1 and C2. The post-stage circuit 600 includes inverter circuits IV5 and IV6, p-type MOSFETs PM5, PM6, PM7, PM8, PM19, PM20, PM22, PM21, PM23, and PM25, and an n-type MOSFET NM24. A configuration and an operation that are different from those of the comparative example will be principally described below. In points that will not be described of configurations and operations according to the first embodiment and the second embodiment described later, the entire description of the comparative example will be applied.

The capacitor C1 is coupled in parallel between the node ND and the node NA.

The capacitor C2 is coupled in parallel between the node NE and the node NB.

The transistor PM19 is coupled between the node NVDDB and a node NK. The Node NVDDB receives the voltage VDDB. The transistor PM19 receives a control signal SW1 at a gate.

The transistor PM5 is coupled between the node NK and a node NH.

The transistor PM6 is coupled between the node NK and the node NJ.

The transistor PM8 is coupled between the node NJ and the node NE. The transistor PM8 is coupled to the node ND at a gate.

The transistors PM20 and PM22 are coupled in series in this order between the node ND and the node NVSS. The transistor PM20 receives a control signal SW2 at a gate. The transistor PM22 is coupled to the node NVDDA at a gate.

The transistors PM21 and PM23 are coupled in series in this order between the node NE and the node NVSS. The transistor PM21 receives the control signal SW2 at a gate. The transistor PM23 is coupled to the node NVDDA at a gate.

The transistors PM15 and NM16 are coupled in series in this order between the node NVDDB and a node NI.

The transistor NM24 is coupled between the node NI and the node NVSS. The transistor NM24 receives a control signal SW3 at a gate.

The transistor PM25 is coupled between the node NVDDB and the node NF. The transistor PM25 receives the control signal SW3 at a gate.

Respective breakdown voltages of transistors included in the inverter circuits IV1, IV2, IV3, and IV4, and the transistors NM9 and NM10 are lower than breakdown voltages of the transistors PM5, PM6, PM7, PM8, PM19, PM20, PM21, PM22, PM23, NM24, and PM25, and transistors included in the inverter circuits IV5 and IV6. Stated another way, respective breakdown voltages of transistors PM1, NM2, PM3, NM4, PM11, NM13, PM12, NM14, NM9, and NM10 included in the pre-stage circuit 500 are lower than breakdown voltages of the transistors PM5, PM6, PM7, PM8, PM15, NM16, PM17, NM18, PM19, PM20, PM21, PM22, PM23, NM24, and PM25 included in the post-stage circuit 600. The low breakdown voltage transistor may be an LVMOS transistor, and the high breakdown voltage transistor may be an HVMOS transistor or an MVMOS transistor.

1.2. Operation

Figure 7:
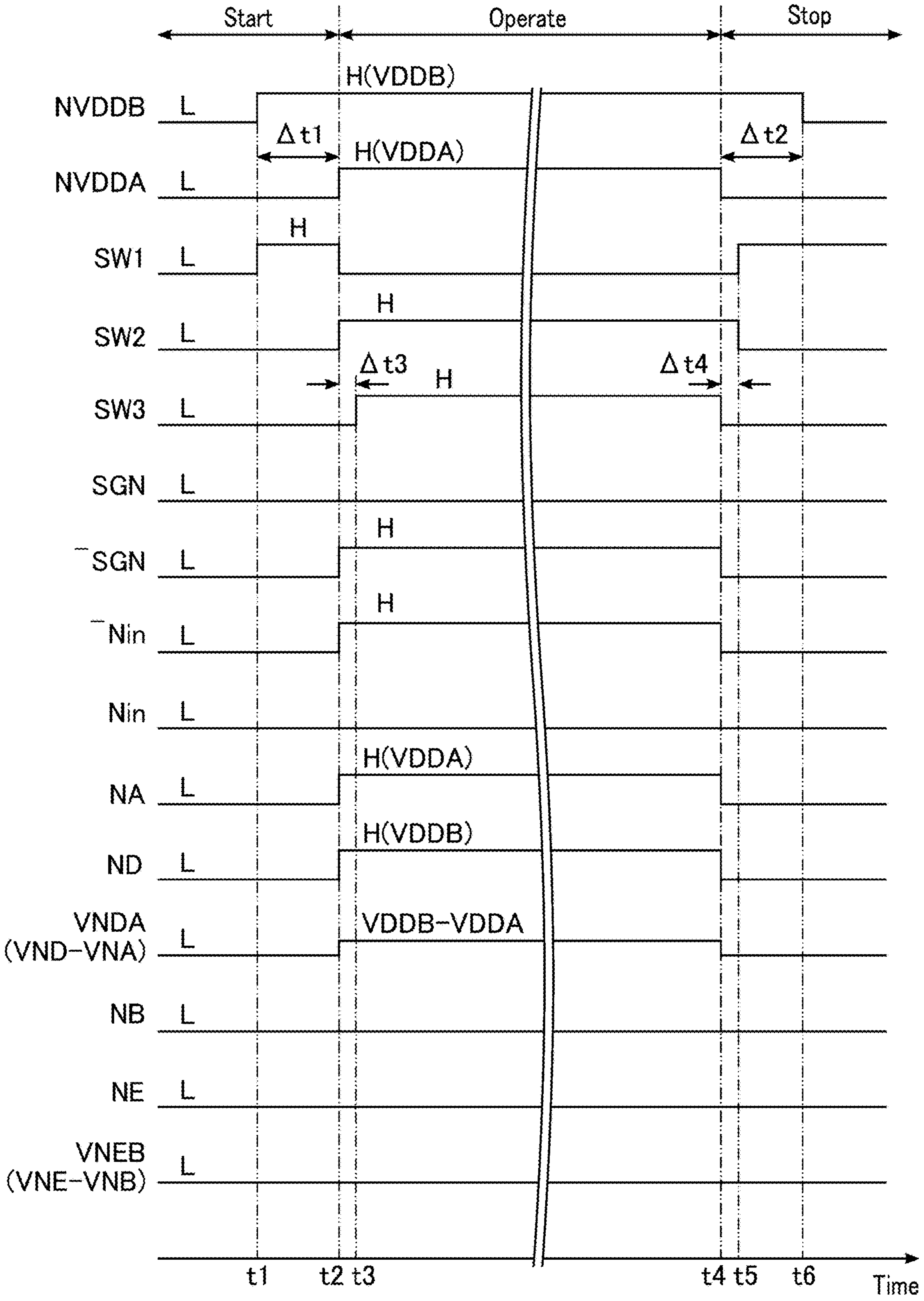
FIG. 7 illustrates, along the time axis, potentials of some nodes and potentials of some signals during starting and during stopping of the level shifting circuit according to the first embodiment.

FIG. 7 illustrates, along the time axis, potentials of some nodes and potentials of some signals during starting and during stopping of the level shifting circuit according to the first embodiment. A period of starting ranges from the start of the period illustrated in FIG. 7 to time t2. A period of stopping ranges from time t4 to the end of the period illustrated in FIG. 7.

At a point in time of the start of the period illustrated in FIG. 7, all of the nodes and the signals that are illustrated in FIG. 7 have a low (L) level or the potential VSS. Both nodes NVDDA and NVDDB have the low level, and therefore the level shifting circuit 11 is not operating, and the nodes NA, ND, NB, and NE have the low level.

The control signal SW1 has the low level, and therefore the transistor PM19 is in an ON state, and the node NK is coupled to the node NVDDB.

The control signal SW2 has the low level, and therefore the transistors PM20 and PM21 are in the ON state. the Node NVDDA has the low level, and therefore the transistors PM22 and PM23 are in the ON state. The transistors PM20, PM21, PM22, and PM23 are in the ON state, and therefore the node ND and the node NE are coupled to the node NVSS, and have the potential of the node NVSS.

The control signal SW3 has the low level, and therefore the transistor NM24 is in an OFF state, and the transistor PM25 is in the ON state. The transistor NM24 is in the OFF state, and therefore the node NI is decoupled from the node NVSS. The Node NI is decoupled from node NVSS, and therefore the inverter circuit IV5 is disabled. The transistor PM25 is in the ON state, and therefore the node NF is coupled to the node NVDDB.

At time t1, the control signal SW1 has the high level. As a result of this, the transistor PM19 is turned off, and the node NK is disconnected from the node NVDDB. Due to leakage currents of the transistors PM5, PM6, PM7, and PM8, a current flows from the node NK into the node ND and the node NE, and a potential of the node ND or the node NE can rise. However, the potential VDDB is not applied to the node NK via the node NVDDB, and therefore even if the leakage current is generated in the transistors PM5, PM6, PM7, and PM8, the potentials of the node ND and the node NE are prevented from rising. Therefore, even at time t1, the node ND and the node NE keep the low level.

It takes time for the regulator circuit 40 to start to output the voltage VDDA after the voltage VDDB started to be applied. Therefore, even at time t1, the potential of the node NVDDA has the low level, and the node NA and the node ND have the low level. Therefore, a potential difference VNDA has the low level (substantially zero), and a potential difference VNEB has the low level.

At time t1, the regulator circuit 40 starts operation, and at time t2 after a period Δt1 passed from time t1, the transistors PM22 and PM23 are turned off based on the node NVDDA having the high-level potential.

At time t2, the control signal SW1 has the low level. As a result of this, the node NK is coupled to the node NVDDB, and the potential VDDB on the node NVDDB is transmitted to the node NK. As a result of this, the level shifting circuit 11 is enabled.

At time t2, the control signal SW2 has the high level. As a result of this, the transistors PM20 and PM21 are turned off.

Based on the transistors PM20, PM21, PM22, and PM23 being turned off, the node ND and the node NE are disconnected from the node NVSS.

At time t3 after a period Δt3 passed from time t2, the control signal SW3 has the high level. As a result of this, the node NI is coupled to the node NVSS. Therefore, the inverter circuit IV5 and the level shifting circuit 11 are enabled.

Based on the control signal SW3 having the high level, the transistor PM25 is turned off, the node NF is disconnected from the node NVDDB, and a potential based on the potential of the node NF is output as the signal Sout.

From time t3, the level shifting circuit 11 has been in the operation state. The potentials of some nodes and the potentials of some signals in the operation state will be described later with reference to FIG. 8.

At time t2, the node ND and the node NE are disconnected from the node NVSS, and the potentials of the node ND and the node NE can receive an inflow of a current due to the leakage currents of the transistors PM5, PM6, PM7, and PM8. As a result of this, either the node ND or the node NE can reach the high level. FIG. 7 illustrates an example where the node ND reaches the high level. As a result of the node ND reaching the high level, the potential difference VNDA has a magnitude obtained by subtracting the magnitude of the potential VDDA from the magnitude of the potential VDDB. A difference between the potential VDDB and the potential VDDA is small, and therefore the potential difference VNDA is small.

At and after time t4, both the signals SGN and $\overline{SGN}$ keep the low level. FIG. 7 illustrates an example where the signal $\overline{SGN}$ reaches the low level from the high level at time t4. Based on the signal $\overline{SGN}$ reaching the low level, the node NA and the node ND have the low level.

Based on the node NVDDA having the low-level potential, the transistor NM9 is turned off. As a result of this, the node ND and the node NA are disconnected. Based on the node NVDDA having the low-level potential, the transistor NM10 is turned off. As a result of this, the node NE and the node NB are disconnected.

Based on the node NVDDA having the low-level potential, the transistors PM22 and PM23 are turned off.

At time t4, the control signal SW3 has the low level. As a result of this, the transistor NM24 is turned off, and the inverter circuit IV5 is disabled. Based on the control signal SW3 having the low level, the transistor PM25 is turned on. As a result of this, the potential of the node NF is fixed to the potential of the node NVDDB.

At time t5 after a period Δt4 passed from time t4, the control signal SW2 has the low level. As a result of this, the transistors PM20 and PM21 are turned on.

Based on the transistors PM20, PM21, PM22, and PM23 being turned on, the node ND and the node NE are coupled to the node NVSS, and are fixed to have the potential of the node NVSS.

At time t5, the control signal SW1 has the high level. As a result of this, the transistor PM19 is turned off. As a result of the transistor PM19 being turned off, the node NK is disconnected from the node NVDDB, and the potential of the node NVDDB is not transmitted to the node NK. Accordingly, even if a leakage current is generated in the transistors PM20, PM21, PM22, and PM23, the potentials of the node ND and the node NE are prevented from rising. Therefore, even at time t5, the node ND and the node NE keep the low level. Accordingly, the potential difference VNDA keeps the low level.

Figure 8:
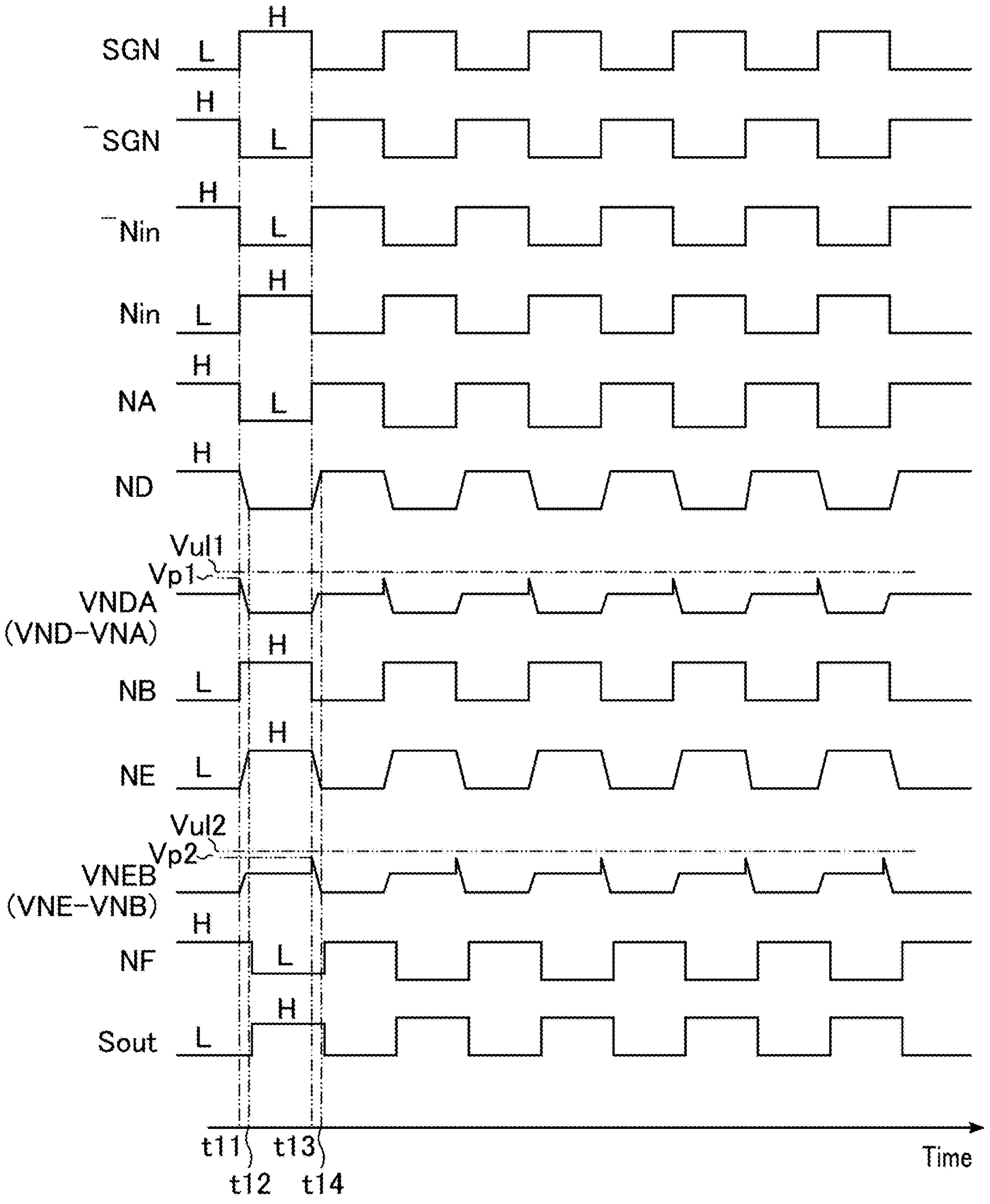
FIG. 8 illustrates, along the time axis, potentials of some nodes and potentials of some signals during operation of the level shifting circuit according to the first embodiment.

FIG. 8 illustrates, along the time axis, potentials of some nodes and potentials of some signals during operation of the level shifting circuit according to the first embodiment. FIG. 8 illustrates a period of operation, that is, a period between time t3 and t4 of the period illustrated in FIG. 7. FIG. 8 illustrates, as an example, a case where the signal SGN is a clock.

As described above with reference to FIG. 5, a change in the potential of the node ND is behind a change in the potential of the node NA. Therefore, before the potential of the node ND reaches the low level and the potential difference VNDA becomes substantially zero at time t12, and immediately after time t11, the potential difference VNDA has a peak magnitude Vp1. Accordingly, a voltage having substantially the same magnitude as the magnitude of the potential Vp1 is applied to the transistor NM9. However, the node NA and the node ND are coupled by the capacitor C1, and therefore a decrease in the potential of the node ND is close to a decrease in the potential of the node NA. Therefore, the peak magnitude Vp1 of the potential difference VNDA is lower than a voltage Vul1. Stated another way, the potential difference VNDA is always lower than the voltage Vul1.

As described above with reference to FIG. 5, a change in the potential of the node NE is behind a change in the potential of the node NB. The potential of the node NE has the high level at the time after time t11. Here, the node NB oscillates between the voltage VSS and the voltage VDDA, and the node NE oscillates between the voltage VSS and the voltage VDDB. Based on the node NE having the high-level potential, the potential difference VNEB has a magnitude obtained by subtracting the magnitude of the potential VDDA from the magnitude of the potential VDDB.

At the time after time t11, the potential of the node NF has an inverted logic level of a logic level of the signal SGN, namely, the low level. Based on the node NF having a low-level potential, the signal Sout has the high level.

As described above, a change in the potential of the node NE is behind a change in the potential of the node NB. Therefore, before the potential of the node NE reaches the low level and the potential difference VNEB becomes substantially zero at time t14, and immediately after time t13, the potential difference VNEB has a peak magnitude Vp2. Accordingly, a voltage having substantially the same magnitude as the magnitude of the potential Vp2 is applied to the transistor NM10. However, the node NB and the node NE are coupled by the capacitor C2, and therefore a decrease in the potential of the node NE is close to a decrease in the potential of the node NB. Therefore, the peak magnitude Vp2 of the potential difference VNEB is lower than a voltage Vul2. Stated another way, the potential difference VNEB is always lower than the voltage Vul2.

As described above, a change in the potential of the node ND is behind a change in the potential of the node NA. Therefore, the potential of the node ND has the high level at the time after time t13. Here, the node NA receives the voltage VDDA, and the node ND receives the voltage VDDB. Based on the node ND having the high-level potential, the potential difference VNDA has a magnitude obtained by subtracting the magnitude of the potential VDDA from the magnitude of the potential VDDB.

At the time after time t13, the potential of the node NF has an inverted logic level of a logic level of the signal SGN, namely, the high level. Based on the node NF having the high-level potential, the signal Sout has the low level.

An operation that occurs as a result of the signal SGN having the high level after time t14 is the same as an operation that occurs as a result of the signal SGN having the high level at time t11.

An operation that occurs as a result of the signal SGN having the low level at and after time t14 is the same as an operation that occurs as a result of the signal SGN having the low level at time t13.

Figure 9:
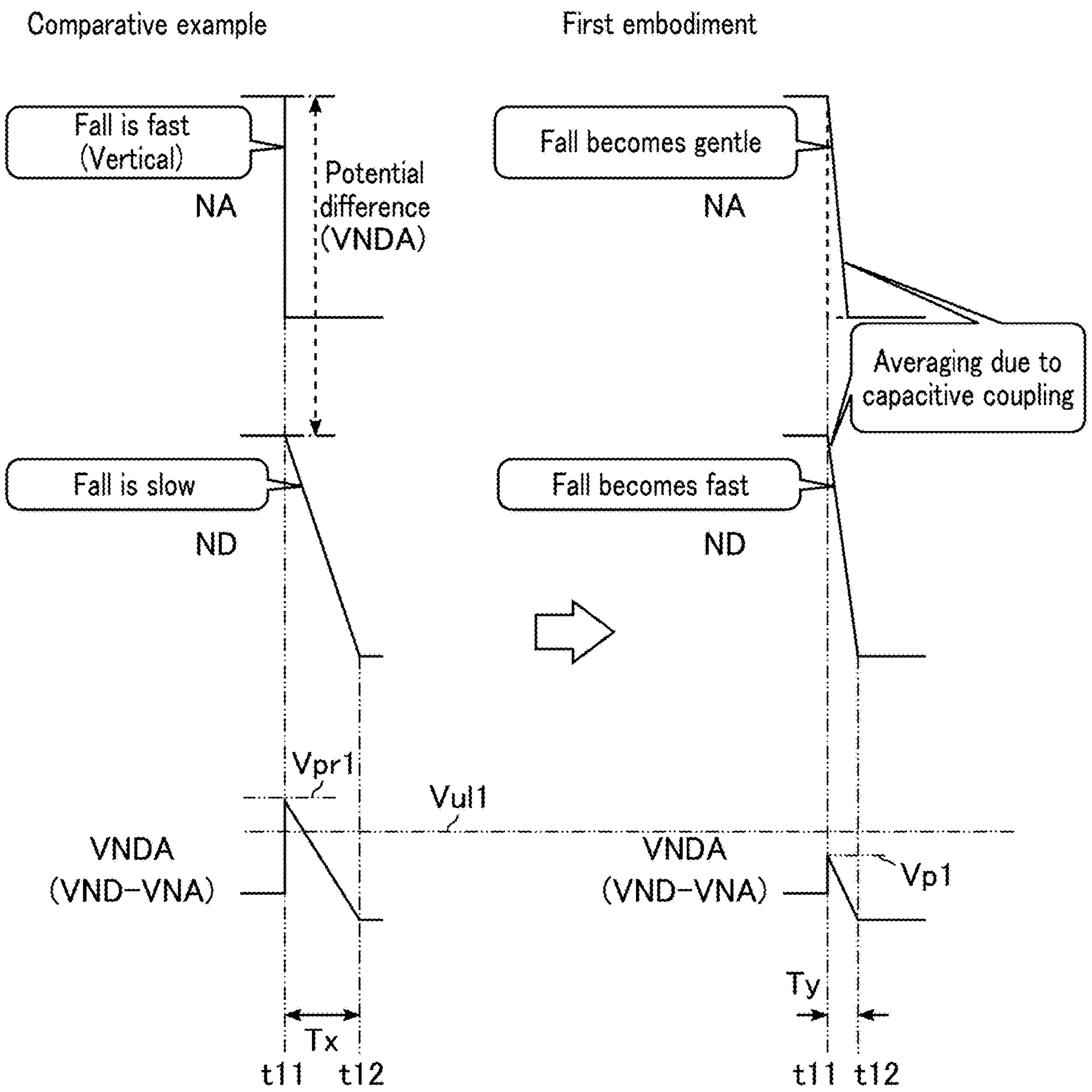
FIG. 9 illustrates, along the time axis, potentials of some nodes during operation of the level shifting circuits according to the first embodiment and in the comparative example.

The potential differences VNDA in the comparative example and according to the first embodiment will be described in detail. FIG. 9 illustrates, along the time axis, potentials of some nodes during operation of the level shifting circuits according to the first embodiment and in the comparative example. FIG. 9 illustrates the potentials of nodes NA and ND of FIGS. 5 and 8 at and after time t11 in an enlarged manner. As illustrated in FIG. 9, in the comparative example, the potential of the node NA vertically falls. Furthermore, as described above with reference to FIG. 5, a change in the potential of the node ND is behind a change in the potential of the node NA. For example, it is assumed that it takes a time period Tx for the potential of the node ND to finish falling. A fall of the potential of the node ND is slower than a fall of the potential of the node NA, and therefore the potential difference VNDA in the comparative example is greater than or equal to the voltage Vul1.

In the first embodiment, as illustrated in FIG. 9, the potential of the node NA does not vertically fall, and falls more gently than in the comparative example. On the other hand, the potential of the node ND falls faster than in the comparative example. For example, it takes a time period Ty for the potential of the node ND according to the first embodiment to finish falling. The time period Ty is shorter than the time period Tx, and the falling time of the potential of the node NA and the falling time of the potential of the node ND are close to each other. The reason is that the node NA and the node ND are capacitively coupled by the capacitor C1 so that a change in the potential of the node NA and a change in the potential of the node ND are averaged. Therefore, the potential difference VNDA according to the first embodiment is less than or equal to the voltage Vul1. Note that the node NA and the node ND, and the potential difference VNDA is described here, but the same phenomenon occurs for the node NB and the node NE, and the voltage difference VNEB.

1.3. Advantages (Advantageous Effects)

According to the first embodiment, the peak magnitude Vp1 of the potential difference VNDA is reduced. Similarly, the peak magnitude Vp2 of the potential difference VNEB is reduced. Therefore, the reliability of the transistors NM9 and NM10 is prevented from deteriorating.

Furthermore, according to the first embodiment, the transistor PM19 is provided between the node NVDDB and the node NK, the transistors PM20 and PM22 are provided between the node ND and the node NVSS, and the transistors PM21 and PM23 are provided between the node NE and the node NVSS. The transistor PM19 is in the OFF state while the node NVDDB has the potential VDDB and the node NVDDA has the potential VSS. Therefore, the potential VDDB on the node NVDDB prevents the node ND or the node NE from rising to the potential VDDB. Accordingly, a potential difference having a magnitude obtained by subtracting the magnitude of the potential VSS from the magnitude of the potential VDDB is prevented from occurring across ends of the transistor NM9 or NM10, and the reliability of the transistors NM9 and NM10 is prevented from deteriorating.

The transistors PM20, PM21, PM22, and PM23 are in the ON state, while the node NVDDB has the potential VDDB and the node NVDDA has the potential VSS. Therefore, the node ND and the node NE are coupled to the node NVSS by the transistors PM20, PM21, PM22, and PM23, while the node NVDDB has the potential VDDB, and the node NVDDA has the potential VSS. Accordingly, even if the potential VDDB on the node NVDDB and a leakage current of the transistor PM19 flow into the node ND or the node NE, the potentials of the node ND and the node NE are prevented from rising.

The level shifting circuit according to the first embodiment includes the transistors NM24 and PM25. While the node NVDDB has the potential VDDB and the node NVDDA has the potential VSS, the transistor NM24 is in the OFF state, and the transistor PM25 is in the ON state. Therefore, while the node NVDDB has the potential VDDB and the node NVDDA has the potential VSS, the signal Sout is fixed to the low level, and is prevented from reaching an intermediate level. This avoids a phenomenon in which the signal Sout having the intermediate level turn on both a p-type transistor and an n-type transistor of an inverter circuit that receives the signal Sout, and a current flows between a node having a power supply potential and a node having a common potential via these transistors.

Moreover, the level shifting circuit according to the first embodiment includes the capacitors C1 and C2, and the transistors PM19, PM20, PM21, PM22, PM23, PM24, and PM25. As a result of this, even if the transistors of the pre-stage circuit 500 are implemented by an LVMOS transistor, the reliability of the LVMOS transistors can be prevented from deteriorating. Stated another way, even if an HVMOS transistor or an MVMOS transistor is not applied to the transistors of the pre-stage circuit 500, the reliability of the transistors can be prevented from deteriorating. As a result of this, current consumption of the level shifting circuit can be reduced without impairing the reliability of the transistors, in comparison with a case where the transistors of the pre-stage circuit 500 are implemented by the HVMOS transistor. Furthermore, the mounting area of the level shifting circuit can be reduced without impairing the reliability of the transistors.

2. Second Embodiment

Figure 10:
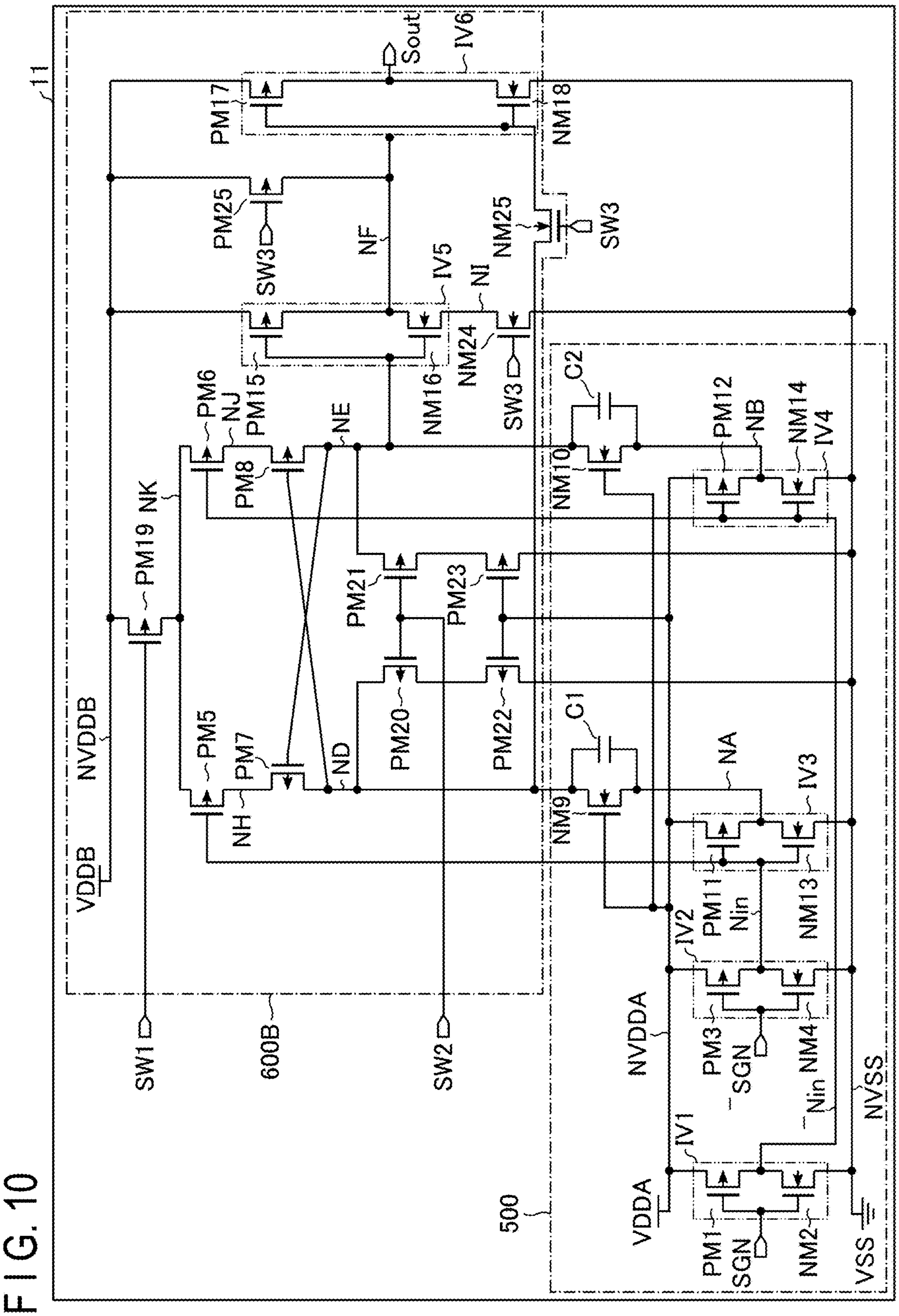
FIG. 10 is a circuit diagram of a level shifting circuit according to a second embodiment.

FIG. 10 is a circuit diagram of a level shifting circuit according to a second embodiment. As illustrated in FIG. 10, a level shifting circuit 11B according to the second embodiment is different from the level shifting circuit according to the first embodiment in that a post-stage circuit 600B further includes an n-type MOSFET NM25. Description of configurations and operations that are similar to those in the first embodiment will be omitted. The transistor NM25 of the level shifting circuit 11B is coupled between the node ND and the node NF. The transistor NM25 receives a control signal SW3 at a gate.

While the level shifting circuit 11B is operating, the control signal SW3 has a high level, and therefore the transistor NM25 is in an ON state. Therefore, the potential of the node ND is added to the potential of the node NF. The Node ND has an inverted logic level of the logic level of a signal SGN, and therefore in a case where the logic level of the signal SGN reached a high level, the potential of the node ND reaches a low level. The low-level potential of the node ND assists in a fall of the potential of the node NF, and the fall of the potential of the node NF is expedited. On the other hand, in a case where the logic level of the signal SGN reached the low level, a high-level potential of the node ND assists in a rise of the potential of the node NF, and the rise of the potential of the node NF is expedited. Therefore, the potential of the node NF has a high duty cycle.

According to the second embodiment, the level shifting circuit 11B can output a signal Sout having a high duty cycle. As a result of the above, the level shifting circuit according to the second embodiment can enhance the precision of communication between a memory device and a memory controller in addition to the advantages of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A level shifting circuit comprising:

a first inverter that is coupled between a first node and a second node, includes a first input node that receives a first signal, and includes a first output node, the first node receiving a first potential, the second node receiving a second potential that is lower than the first potential;

a second inverter that is coupled between the first node and the second node, includes a second input node that receives a signal that is complementary to the first signal, and includes a second output node;

a first transistor that is coupled between a third node and a fourth node, and includes a gate that is coupled to the first input node, the third node receiving a third potential that is higher than the first potential;

a second transistor that is coupled between the fourth node and a fifth node, and includes a gate that is coupled to a sixth node;

a third transistor that is coupled between the third node and a seventh node, and includes a gate that is coupled to the second input node;

a fourth transistor that is coupled between the seventh node and the sixth node, and includes a gate that is coupled to the fifth node;

a fifth transistor that is coupled between the fifth node and the first output node, and includes a gate that is coupled to the first node;

a first capacitor that is coupled between the fifth node and the first output node;

a sixth transistor that is coupled between the sixth node and the second output node, and includes a gate that is coupled to the first node; and a second capacitor that is coupled between the sixth node and the second output node.

2. The level shifting circuit according to claim 1, further comprising:

a seventh transistor that is coupled between the third node and the first transistor, and between the third node and the third transistor;

an eighth transistor that is coupled between the fifth node and an eighth node;

a ninth transistor that is coupled between the eighth node and the second node, and includes a gate that is coupled to the first node;

a tenth transistor that is coupled between the sixth node and a ninth node, and includes a gate that is coupled to a gate of the eighth transistor; and an eleventh transistor that is coupled between the ninth node and the second node, and includes a gate that is coupled to the first node.

3. The level shifting circuit according to claim 2, wherein the seventh transistor includes a gate that receives a second signal, the gate of the eighth transistor and the gate of the tenth transistor receive a third signal, and during a first period during which the third node has the third potential and the first node has the second potential, the second signal has a potential magnitude that turns off the seventh transistor, and the third signal has a potential magnitude that turns on the eighth transistor and the tenth transistor.

4. The level shifting circuit according to claim 3, wherein the first period includes a second period, a third period, and a fourth period in this order, in the second period, the first node has the second potential and the third node has the third potential, in the third period, the first node has the first potential and the third node has the third potential, and in the fourth period, the first node has the second potential and the third node has third potential.

5. The level shifting circuit according to claim 2, further comprising:

a third inverter that is coupled between the third node and a tenth node, includes a third input node that is coupled to the sixth node, and includes a fourth output node;

an eleventh transistor that is coupled between the tenth node and the second node;

a twelfth transistor that is coupled between the third node and the fourth output node; and a fourth inverter that is coupled between the third node and the second node, and includes an input node that is coupled to the fourth output node.

6. The level shifting circuit according to claim 5, wherein the seventh transistor includes a gate that receives a second signal, the gate of the eighth transistor and the gate of the tenth transistor receive a third signal, the eleventh transistor includes a gate that receives a fourth signal, the twelfth transistor includes a gate that receives the fourth signal, and during a first period during which the third node has the third potential and the first node has the second potential, the second signal has a potential magnitude that turns off the seventh transistor, the third signal has a potential magnitude that turns on the eighth transistor and the tenth transistor, and the fourth signal has a potential magnitude that turns on the eleventh transistor and turns on the twelfth transistor.

7. The level shifting circuit according to claim 6, further comprising a thirteenth transistor that is coupled between the fifth node and the fourth output node.

8. The level shifting circuit according to claim 7, wherein the thirteenth transistor includes a gate that receives the fourth signal, and while the third node has the third potential and the first node has the first potential, the fourth signal has a potential magnitude that turns on the thirteenth transistor.

9. The level shifting circuit according to claim 1, further comprising:

a third inverter that is coupled between the third node and a tenth node, includes a third input node that is coupled to the sixth node, and includes a fourth output node;

an eleventh transistor that is coupled between the tenth node and the second node;

a twelfth transistor that is coupled between the third node and the fourth output node; and a fourth inverter that is coupled between the third node and the second node, and includes an input node that is coupled to the fourth output node.

10. The level shifting circuit according to claim 9, wherein the eleventh transistor includes a gate that receives a fourth signal, the twelfth transistor includes a gate that receives the fourth signal, and during a first period during which the third node has the third potential and the first node has the second potential, the fourth signal has a potential magnitude that turns on the eleventh transistor and turns on the twelfth transistor.

11. The level shifting circuit according to claim 9, further comprising a thirteenth transistor that is coupled between the fifth node and the fourth output node.

12. The level shifting circuit according to claim 11, wherein the thirteenth transistor includes a gate that receives a fourth signal, and while the third node has the third potential and the first node has the first potential, the fourth signal has a potential magnitude that turns on the thirteenth transistor.

13. The level shifting circuit according to claim 1, wherein a breakdown voltage of each of a transistor included in the first inverter, a transistor included in the second inverter, the fifth transistor, and the sixth transistor is lower than respective breakdown voltages of the first transistor, the second transistor, the third transistor, and the fourth transistor.

14. The level shifting circuit according to claim 1, wherein the first inverter includes:

a fourteenth transistor that is coupled between the first node and the first output node, and includes a gate that is coupled to the first input node; and a fifteenth transistor that is coupled between the first output node and the second node, and includes a gate that is coupled to the first input node, the second inverter includes:

a sixteenth transistor that is coupled between the first node and the second output node, and includes a gate that is coupled to the second input node; and a seventeenth transistor that is coupled between the second output node and the second node, and includes a gate that is coupled to the second input node, and a breakdown voltage of each of the fifth transistor, the sixth transistor, the fourteenth transistor, the fifteenth transistor, the sixteenth transistor, and the seventeenth transistor is lower than respective breakdown voltages of the first transistor, the second transistor, the third transistor, and the fourth transistor.

15. The level shifting circuit according to claim 1, further comprising:

a fifth inverter that is coupled between the first node and the second node, includes an input node that receives a fifth signal, and includes an output node that is coupled to the second input node; and a sixth inverter that is coupled between the first node and the second node, includes an input node that receives a sixth signal that is complementary to the fifth signal, and includes an output node that is coupled to the first input node.

16. The level shifting circuit according to claim 15, wherein a breakdown voltage of each of a transistor included in the first inverter, a transistor included in the second inverter, a transistor included in the fifth inverter, a transistor included in the sixth inverter, the fifth transistor, and the sixth transistor is lower than respective breakdown voltages of of the first transistor, the second transistor, the third transistor, and the fourth transistor.

17. The level shifting circuit according to claim 16, wherein the first inverter includes:

a fourteenth transistor that is coupled between the first node and the first output node, and includes a gate that is coupled to the first input node; and a fifteenth transistor that is coupled between the first output node and the second node, and includes a gate that is coupled to the first input node, the second inverter includes:

a sixteenth transistor that is coupled between the first node and the second output node, and includes a gate that is coupled to the second input node; and a seventeenth transistor that is coupled between the second output node and the second node, and includes a gate that is coupled to the second input node, the fifth inverter includes:

an eighteenth transistor that is coupled between the first node and the second input node, and includes a gate that receives the fifth signal; and a nineteenth transistor that is coupled between the second input node and the second node, and includes a gate that receives the fifth signal, the sixth inverter includes:

a twentieth transistor that is coupled between the first node and the first input node, and includes a gate that receives the sixth signal; and a twenty-first transistor that is coupled between the first input node and the second node, and includes a gate that receives the sixth signal, and a breakdown voltage of each of the fifth transistor, the sixth transistor, the fourteenth transistor, the fifteenth transistor, the sixteenth transistor, the seventeenth transistor, the eighteenth transistor, the nineteenth transistor, the twentieth transistor, and the twenty-first transistor is lower than respective breakdown voltages of the first transistor, the second transistor, the third transistor, and the fourth transistor.

* * * * *